(12) United States Patent
Cheng et al.

(10) Patent No.: US 6,240,131 B1
(45) Date of Patent: May 29, 2001

(54) DIGITALLY CONTROLLED TRANSMISSION LINE EQUALIZER

(75) Inventors: Yi Cheng, San Jose; Kris M. Holt, Pleasanton, both of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 08/884,932

(22) Filed: Jun. 30, 1997

(51) Int. Cl.$^7$ ........................................ H03H 7/30
(52) U.S. Cl. ................................ 375/229; 375/350
(58) Field of Search .................... 375/229, 232, 375/230, 350; 455/307; 327/552, 553, 555, 554

(56) References Cited

U.S. PATENT DOCUMENTS

| | | | |
|---|---|---|---|
| 5,257,286 | 10/1993 | Ray | 375/12 |
| 5,508,656 | * 4/1996 | Jaffard et al. | 330/9 |
| 5,528,179 | * 6/1996 | Siniscalchi et al. | 327/103 |
| 5,570,398 | * 10/1996 | Smith | 375/376 |
| 5,606,277 | * 2/1997 | Feliz | 327/553 |

* cited by examiner

Primary Examiner—Chi Pham
Assistant Examiner—Kevin M Burd
(74) Attorney, Agent, or Firm—Fliesler Dubb Meyer & Lovejoy LLP

(57) ABSTRACT

A filter has a transfer function. The filter includes a signal input for receiving an input signal and a signal output operatively coupled to the signal input for providing an output signal. A ratio of the output signal to the input signal is equal to the filter's transfer function. The filter also includes a set of control inputs, wherein each control input in the set of control inputs is adapted for providing a digital signal. Each selectable transconductive load in a set of selectable transconductive loads has a transconductance and is operatively coupled to the signal output and a control input in the set of control inputs. The transfer function is set in response to a digital signal provided by at least one control signal in the set of control signals. Each selectable transconductive load is selected in response to at least one control signal in the set of control signals. Accordingly, the value for the transfer function is further dependent upon transconductances provided by selectable transconductive loads that are selected.

33 Claims, 11 Drawing Sheets

DIGITALLY CONTROLLED TRANSMISSION LINE EQUALIZER

BACKGROUND OF THE INVENTION

1. Field of the Invention

The present invention is directed toward the field of transmission line filters.

2. Description of the Related Art

In data communications systems, data is transferred over transmission lines at high frequencies. For example, in a data communications network that complies with the Institute of Electrical and Electronics Engineers ("IEEE") 802.3u Standard for data communications, differential three level analog baseband signals are transferred over transmission lines at a rate of 125 megahertz ("MHZ").

The IEEE 802.3u Standard supports both a 100 Base-T4 standard and a 100 Base-TX standard. In 100 Base-T4, Category 3 type twisted pair wire having lengths up to 100 meters is used to transmit data. In 100 Base-TX, either Category 5 shielded or Category 5 unshielded twisted pair wire having lengths up to 100 meters is used to transmit data.

During a high frequency transmission of signals, such as the signal transmissions in IEEE 802.3u 100 Base-T4 and 100 Base-TX networks, signals become severely attenuated and undergo significant phase shifts. FIG. 1 shows two graphs 100 and 110. Graph 100 illustrates the loss of amplitude that high frequency signals suffer on different lengths of the Category 5 unshielded twisted pair cable. The vertical axis in graph 100 measures signal amplitude loss in decibels ("db"), and the horizontal axis measures the frequency of the signal on the transmission line.

Curve 101 shows the characteristics of a 100 meter Category 5 unshielded twisted pair cable. For signals in the range of 100 MHZ, the amplitude loss is severe at −20 db. Curves 102, 103, and 104 in graph 100 illustrate the characteristics of Category 5 unshielded twisted pair cables having lengths of 50 meters, 25 meters, and 1 meter, respectively. In the case of curves 102 and 103, the amplitude loss is also shown to be fairly significant at frequencies in the range of 100 MHZ.

Graph 110 illustrates the phase shift that signals undergo at different frequencies on Category 5 unshielded twisted pair cable. Curves 111, 112, 113, and 114 show the phase shift characteristics of Category 5 unshielded twisted pair cables having lengths of 100 meters, 50 meters, 25 meters, and 1 meter, respectively. At a frequency in the range of 100 MHZ, the phase shift for the 100 meter cable 111 exceeds 100 degrees. Similarly undesirable phase shifts are shown in curves 112 and 113.

FIG. 2 illustrates the distortion that is suffered by a differential three level analog signal in a 100 Base-TX IEEE 802.3u compliant network. FIG. 2 shows two streams of bits 120 and 121 each being transmitted on an IEEE 802.3u Standard 100 Base-TX Category 5 unshielded twisted pair cable at a frequency of 125 MHZ. A measure of time is provided on a horizontal axis below the signals in each bit stream 120 and 121.

Bit stream 120 is a set of bits represented by differential three level analog signals afer traveling a distance of 1 meter on a 100 Base-TX Category 5 unshielded twisted pair cable. Bit stream 121 shows the same bits from bit stream 120 after traveling a distance of 100 meters on the same cable. As can be seen from FIG. 2, signals being transferred at 125 MHZ over 100 meters of 100 Base-TX Category 5 unshielded twisted pair cable become very distorted due to both amplitude attenuation and phase shift.

In order to properly receive signals that are transferred over a transmission line at high frequencies, a filter is placed at the receiving end of a transmission. The filter provides compensation to the signal being received, so that the distortions caused by the transmission line are removed. Ideally, the filter has a transfer function that substantially offsets the transfer function of the transmission line. As a result, the filtered signal is substantially the same as the signal provided at the input of the transmission line.

In data communications applications, such as IEEE 802.3u compliant networks, it is further desirable for the transfer function of the filter, to compensate for the different distortions provided by different lengths of transmission line. As shown in FIG. 1, different length transmission lines provide different transfer functions affecting signal amplitude and phase shift.

In the case of filters for data communications applications, it is also desirable for the filter to be implemented using complimentary metal oxide semiconductor ("CMOS") technology that is targeted for digital applications. This will enable the filter to be designed for low power operation. Further, the filter could be integrated onto a single wafer die along with other digital circuits required for implementing an IEEE 802.3u Standard network, such as a transceiver, data terminal equipment node, or repeater.

FIG. 3 illustrates a filter 130 that has a transfer function with poles and zeros that are dependent on specific values of resistors and capacitors employed in the filter 130. The filter 130 includes an operational amplifier ("op-amp") 135 having an output (VOUT) which provides the output of the filter 130. A first input (VPOS) of the op-amp 135 is coupled to ground, while a second input (VNEG) is coupled to two different sets of resistors and capacitors.

One set of a resistor and capacitor includes a resistor 131 having a resistance of R1 connected in parallel to a capacitor 132 having a capacitance C3. Resistor 131 and capacitor 132 each have one end connected to an input signal VIN of the filter 130 and another end connected to the second input (VNEG) of the op-amp 135. The other set of a resistor and a capacitor includes a resistor 133 having a resistance R2 coupled in parallel to a capacitor 134 having a capacitance C4. Resistor 133 and capacitor 134 each have one end connected to the second input (VNEG) of the op-amp 135 and another end connected to the output of the op-amp 135.

The transfer function of a filter is the ratio of the filter's output to the filter's input. Transfer functions for filters are typically expressed in terms of their s-domain equivalent, where s is equal to jω and a capacitance is equal to s times the capacitor's capacitance. The transfer function of the filter 130 in FIG. 3 is equal to the following s-domain expression:

$$\text{VOUT/VIN} = (C3/C4)*(s+1/(R1*C3))/(s+1/(R2*C4)) \quad \text{(Equation 1)}$$

The filter in FIG. 3 therefore has the following pole and zero:

Pole=$1/(R2*C4)$

Zero=$1/(R1*C3)$

In order for the filter 130 in FIG. 3 to provide adequate compensation for the transmission line distortion that a signal suffers, the value of the filter's transfer function will have to be set to offset the transfer function of the transmission line. In the case of filter 130, this requires selecting precise values for R1, R2, C3, and C4. However, it is very difficult, and sometimes not possible, to form resistors and capacitors in integrated circuits with precise resistance and capacitance values.

Further, there is no mechanism in filter 130 to provide for adjusting the transfer function to account for different lengths of transmission line once the resistors 131, 133 and capacitors 132, 134 are selected. It is also very difficult in CMOS technology targeted for digital applications to provide an op-amp with sufficient high gain bandwidth for operating at frequencies of 125 MHZ.

FIG. 4 illustrates a filter 140 that is not dependent on the specific values of components employed in the filter 140. Instead, the filter's transfer function is dependent upon the ratio of capacitors that are switched into the filter 140. The filter 140 includes a network of capacitors 141, 142, 143, 144 and a set of switches 145, 146, 147, 148. The switches 145–148 may be implemented by using transistors. The switches 145–148 couple and decouple capacitors to the inputs and output of an op-amp 149 to set the filter's transfer function in response to an input signal.

In operation, the filter 140 in FIG. 4 requires the switches 145–148 to be controlled by a sample clock having a frequency much higher than the input signal being provided to the filter 140. This enables the sample clock to effectively sample the incoming signal and set the switches 145–148. When the signal being sampled is in the range of 125 MHZ, the required very high frequency sample clock is difficult, and some times not possible, to provide. Further, the filter 140 still requires the use of an op-amp 149 with sufficient high gain bandwidth for operating at frequencies of 125 MHZ. As described above with reference to FIG. 3, such an op-amp is very difficult to provide in CMOS technology targeted for digital applications.

Accordingly, it is desirable to provide a filter that can be implemented in CMOS technology targeted for digital applications. The filter may also avoid the requirement of precise resistor values to set the pole and zero of the filter's transfer function. It is also desirable for the filter to have a transfer function that can compensate for the distortion suffered by high frequency signals on different length transmission lines.

SUMMARY OF THE INVENTION

A filter in accordance with the present invention has a selectable transfer function, which is not a dependent on the precise values of resistors. Instead, the transfer function is dependent on the state of a set of digital control signals, as well as transistor transconductance and gate capacitance. The transconductance and gate capacitance may be reliably controlled in the manufacture of integrated circuits by setting transistor channel lengths and widths. Such a filter may also be manufactured using CMOS technology that is adapted for digital applications.

In embodiments of the present invention, a filter having a first transfer function includes a first signal input for receiving a first input signal and a first signal output that is operatively coupled to the first signal input for providing a first output signal. The ratio of the first output signal to the first input signal is equal to the first transfer function. The filter also includes a set of control inputs. Each control input in the set of control inputs is adapted for providing a digital signal.

A first set of selectable transconductive loads are each operatively coupled to the first signal output and a control input in the set of control inputs. Each selectable transconductive load in the first set of selectable transconductive loads has a transconductance. Each selectable transconductive load in the first set of selectable transconductive loads is selected in response to a signal provided by at least one control signal in the set of control signals. Accordingly, a value for the first transfer function is set in response to a digital signal provided to a selectable transconductive load by at least one control input in the set of control inputs.

A first set of switches is also included in the filter. Each switch in the first set of switches is coupled to both a respective selectable transconductive load in the first set of selectable transconductive loads and a control input in the set of control inputs. A selectable transconductive load in the first set of selectable transconductive loads is selected in response to a digital signal being provided to a switch in the first set of switches that is coupled to the selectable transconductive load. The digital signal that is provided to the switch is supplied by a control input in the set of control inputs.

In accordance with the present invention, the filter may be designed to be fully differential. The fully differential filter includes a second signal input that is operatively coupled to a second signal output. The ratio of a signal at the second signal output to a signal at-the second signal input is equal to a second transfer function. In one embodiment of the present invention, the second transfer function is equal to the first transfer function. As in the case of the first transfer function, the second transfer function is also dependent upon the state of at least one control input in the set of control inputs.

BRIEF DESCRIPTION OF THE DRAWINGS

Further details of the present invention are explained with the help of the attached drawings in which.

DETAILED DESCRIPTION OF THE PREFERRED EMBODIMENTS

Figure 5:
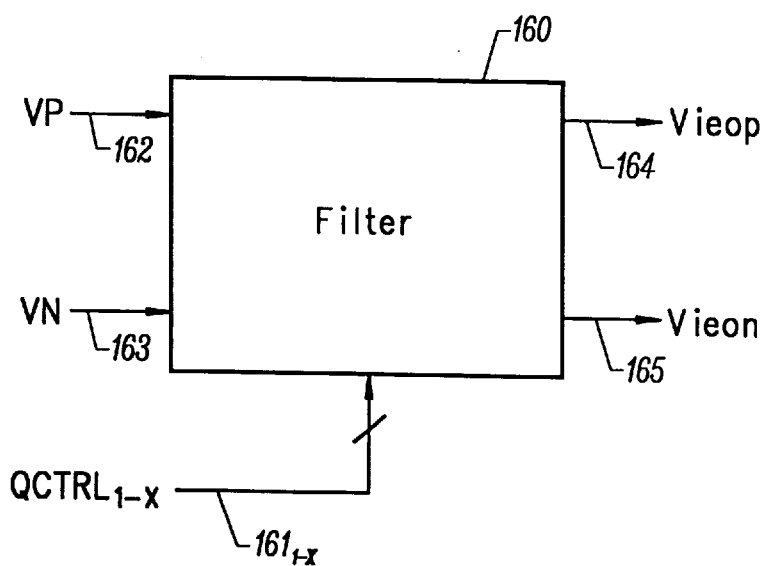
FIG. 5 illustrates a block diagram of a filter in accordance with the present invention.

FIG. 5 illustrates a filter 160 in accordance with the present invention. The filter 160 operates as an equalizer to compensate for the distortion that high frequency signals suffer when being transferred over transmission lines. The filter 160 includes a first signal input 162 and a second signal input 163 for receiving a differential signal from a transmission line.

The filter 160 applies a first transfer function to the signal (VP) provided to input 162 to provide a corresponding Vieop output signal on signal output 164. The filter applies a second transfer function to the signal (VN) provided to input 163 to provide a corresponding Vieon output signal on signal output 165. The Vieop output signal and Vioen output signal combine to form a differential output of the filter 160.

The filter 160 also includes a set of X number of digital control inputs QCTRL(X-1:0)$161_{1-x}$. Each digital control input may be set to be in either an on state or an off state. By setting the states of the digital control inputs $161_{1-x}$, values for the filter's first and second transfer function are selected. This enables the transfer functions to be adjusted to compensate for the signal distortion caused by different length transmission lines. Many different numbers of control signals $161_{1-x}$ ranging from one on up may be employed in different embodiments of the present invention. For example, in one embodiment of the present invention, three control signals QCTRL(2:0) $161_{1-3}$ are employed.

In accordance with the present invention, the filter 160 is designed so that each of its transfer functions is dependent on ratios of transistor transconductance. Unlike precise resistor values, transistor transconductance can be well controlled in the production of integrated circuits by setting the channel widths and lengths of transistors. The digital control signals $161_{1-x}$ provide for the coupling of different combinations of transconductance load transistors to the filter's signal outputs 164, 165. The ability to couple and decouple transistors provides for a set of selectable transconductive loads that may be employed to adjust the filter's transfer functions.

Figure 3:
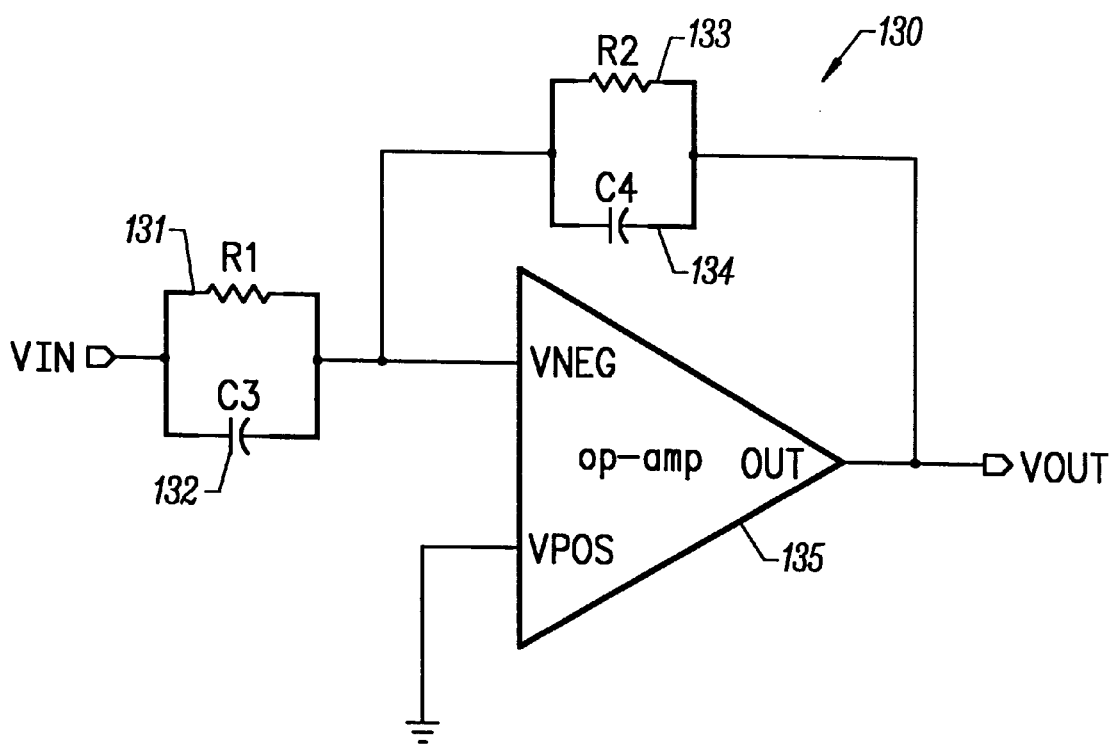
FIG. 3 illustrates a filter having a transfer function that is established by precise resistor and capacitor values.
Figure 4:
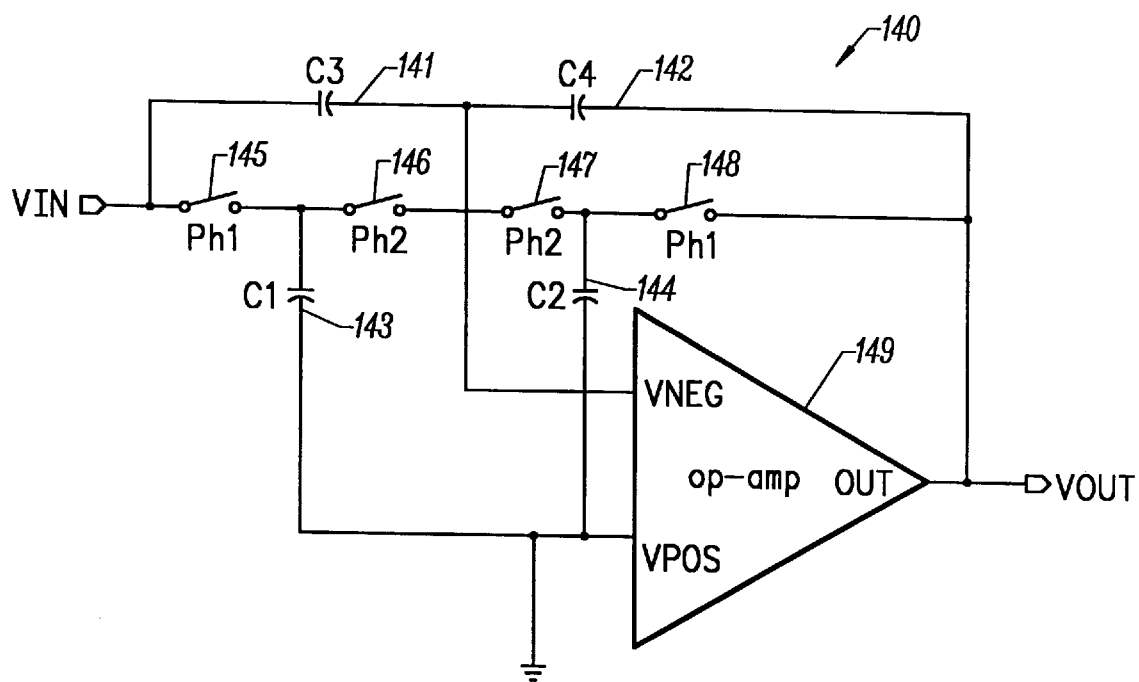
FIG. 4 illustrates a filter having a transfer function that is established by switched capacitors.

The use of digital control signals $161_{1-x}$ in combination with selectable transconductive loads enables the filter 160 to be implemented in CMOS technology that is targeted for digital applications. This differentiates a filter 160 in accordance with the present invention from the filters in FIGS. 3 and 4, which could not be easily implemented in currently available CMOS processes targeted for digital applications, due to the need for a high frequency high gain bandwidth op-amp and a high frequency sample clock.

In one embodiment of the present invention, the filter 160 is adapted to receive differential signal inputs from a 100 Base-TX IEEE 802.3u compliant Category 5 unshielded twisted pair cable. In this case, the first transfer function between the first signal input 162 and the first signal output 164 is equal to the second transfer function between the second signal input 163 and the second signal output 165.

FIGS. 6(a)–6(d) illustrate such an embodiment of the filter 160. The embodiment of the filter 160 shown in FIGS. 6(a)–6(d) has a single stage with the same programmable transfer function for both the first input 162 and output 164 and second input 163 and output 165. In each transfer function, a single zero is programmable with respect to a single pole, and the ratio of the zero to the pole is not dependent on the precise value of any resistor or capacitor. This is important, since the ratio of the zero to the pole shapes the characteristic curve of the transfer function.

Figure 6A:
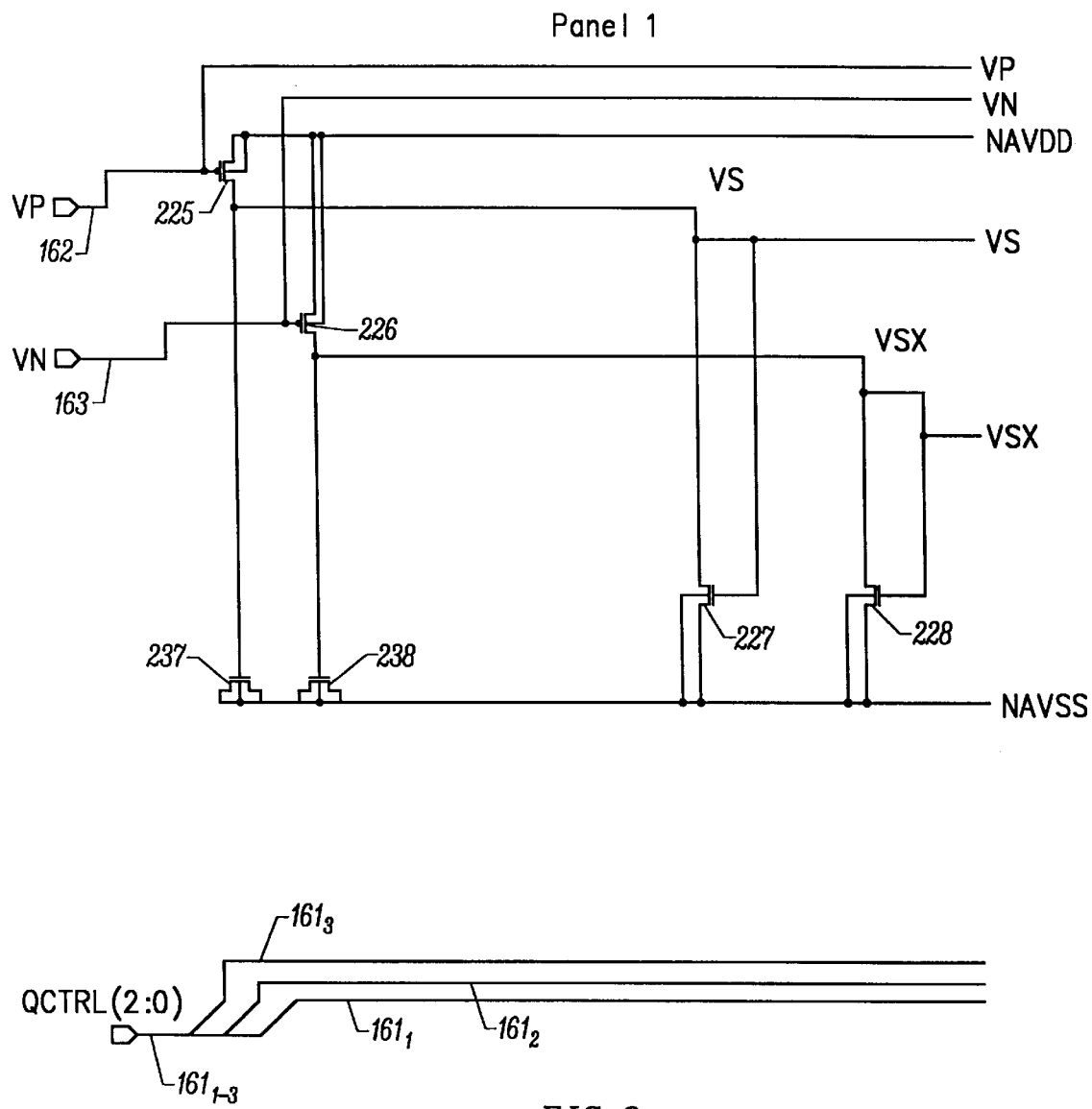
FIGS. 6(*a*)–6(*d*) illustrate a filter in accordance with the present invention.

The embodiment of the filter 160 shown in FIGS. 6(a)–6(d) includes three control inputs $161_{1-3}$, namely QCTRL (2:0) (FIG. 6(a)). Each control input provides a digital signal of either NAVDD or NAVSS. When NAVDD is provided, the control input is said to be turned on. When NAVSS is provided, the control input is said to be turned off.

The filter 160, as shown in FIGS. 6(a)–6(d), also includes a set of twelve selectable transconductive loads 201–212. Each selectable transconductive load has a transconductance, which is indicated by the symbol $G_{NNN}$, wherein NNN is a reference number of the selectable transconductive load.

Each transconductive load is operatively coupled to one of the control inputs $161_{1-3}$ through a respective one of twelve switches 213–224. Each switch 213–224 is coupled to a control input $161_{1-3}$ and provides for a respective transconductive load to be either selected or not selected in response to the signal provided on the coupled control input.

Each selectable transconductive load 201–212 is also operatively coupled to one of the outputs 164, 165 for the filter. The transfer function for a signal passing through the filter 160 from the first signal input 162 to the first signal output 164 is dependent upon the transconductance values provided by the selectable transconductive loads that are selected and coupled to the first output 164. The transfer function for a signal passing through the filter 160 from the second input 163 to the second output 165 is dependent upon the transconductance values provided by the selectable transconductive loads that are selected and coupled to the second signal output 165. A selectable transconductive load is selected when it is enabled to apply a transconductance to either the first signal output 164 or second signal output 165.

The embodiment of the filter 160 shown in FIGS. 6(a)–6(d) also includes a set of 12 fixed transconductive loads 225–236 and two capacitive loads 237, 238. The values of these loads also have an affect on the transfer functions for the filter. The transconductance for each fixed transconductive load is represented by the symbol $G_{NNN}$, wherein NNN is a reference number for the fixed transconductive load. The capacitance provided by each capacitive load 237, 238 is represented by the symbol C for both capacitive loads, since these loads are equal.

The embodiment of the filter 160 shown in FIGS. 6(a)–6(d) is designed to be completely differential. As a result, the transfer function associated with the first signal input 162 and first signal output 164 is equal to the transfer function associated with the second signal input 163 and second signal output 165. In order to achieve this result, for each component affecting one transfer function in the filter 160 there is an identical component affecting the other transfer function in the filter 160. It is also assumed that the signals provided to the first input 162 and second input 163 are fully differential, which is the case with signals in a 100 Base-TX IEEE 802.3u Standard network.

In providing the components for the filter 160, as shown in FIGS. 6(a)–6(d), the following rules are applied:

1. The transconductances for the following pairs of selectable transconductive loads 201–212 are equal:

| Pair (Ref. No.) | Load Relationship |
|---|---|
| 201, 202 | $G_{201} = G_{202}$ |
| 203, 204 | $G_{203} = G_{204}$ |
| 205, 206 | $G_{205} = G_{206}$ |
| 207, 208 | $G_{207} = G_{208}$ |
| 209, 210 | $G_{209} = G_{210}$ |
| 211, 212 | $G_{211} = G_{212}$ |

2. The transconductances for the following groups of fixed transconductive loads 225–236 are equal:

| Group (Ref. No.) | Load Relationship |
|---|---|
| 225, 226, 232, 233 | $G_{225} = G_{226} = G_{232} = G_{233}$ |
| 227, 228, 231, 234 | $G_{227} = G_{228} = G_{231} = G_{234}$ |

-continued

| Group (Ref. No.) | Load Relationship |
|---|---|
| 229, 230 | $G_{229} = G_{230}$ |
| 235, 236 | $G_{235} = G_{236}$ |

3. Capacitive loads 237 and 238 each provide the same capacitive load C.

Accordingly, the transfer function for the first input 161 and first output 164 and the transfer function for the second input 163 and second output 165 may both be represented by the following s-domain expression:

$$Vieop/VP=[(-G_{225})/(G_{235}+!QCTRL(0)*G_{211}+!QCTRL(1)*G_{209}+ \\ !QCTRL(2)*G_{207})]*[(s+(G_{230}+!QCTRL(0)*G_{206}+ \\ !QCTRL(1)*G_{204}+ \\ !QCTRL(2)*G_{202})/C)/(s+G_{227}/C)]$$ (Equation 2)

The expression !QCTRL(x), where x is an integer from 0 to 2 corresponding to one of the control inputs $161_{1-3}$, indicates that the transconductance immediately following the !QCTRL(x) symbol is selected when control input QCTRL(x) is off. For example, selectable transconductance $G_{211}$ is selected and thereby affects the value of the transfer function (Vieop/VP) when control input QCTRL(0)$161_1$ is off. Otherwise, selectable transconductance $G_{211}$ is not selected and does not affect the value of the transfer function.

As shown in FIG. 6(a), the filter 160 includes a first signal input 162 for receiving a first input signal VP and a second signal input 163 for receiving a second input signal VN. The first signal input 162 is formed by the gate of p-channel transistor 225, which has its source and substrate coupled to DC voltage source NAVDD. In one embodiment of the present invention, NAVDD is equal to a voltage in the range of 3 to 5 volts. A voltage VS is provided at the drain of transistor 225, which is coupled to the gate of transistor 237. Transistor 237 provides a capacitive load C that is reflected in the filter's transfer function. The source, drain, and substrate of transistor 237 are coupled to DC voltage potential NAVSS, which is ground in one embodiment of the present invention. The drain of transistor 225 is also coupled to both the gate and drain of transistor 227, which has its source and substrate coupled to NAVSS.

The second signal input 163 is formed by the gate of p-channel transistor 226, which has its source and substrate coupled to DC voltage source NAVDD. A voltage VSX is provided at the drain of transistor 226, which is coupled to the gate of transistor 238. Transistor 238 also provides a capacitive load C that is reflected in the filter's transfer function. The source, drain, and substrate of transistor 238 are coupled to NAVSS. The drain of transistor 226 is also coupled to both the gate and drain of transistor 228, which has its source and substrate coupled to NAVSS.

In the circuit shown in FIGS. 6(a)–6(d) there are twelve switches 213–224. Each of these switches is formed by the combination of a p-channel transistor and a n-channel transistor. The drains of the p-channel transistor and n-channel transistor are connected together to form a switch output. The gates of the p-channel and n-channel transistors are also connected together to form a switch control input. The source of the p-channel transistor in the switch forms a P input for the switch, and source of the n-channel transistor in the switch forms a N input for the switch.

Figure 6B:
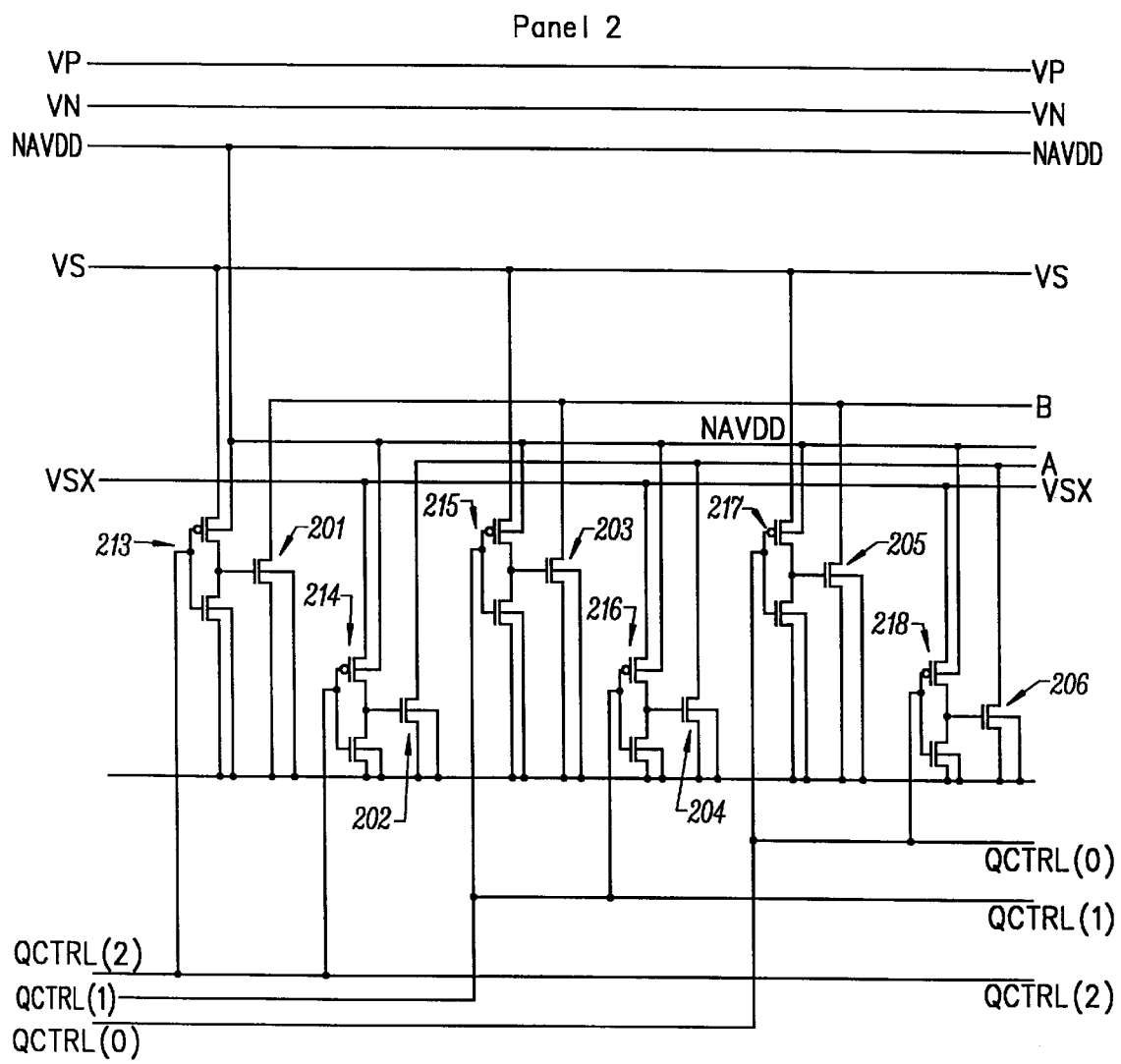

As shown in FIG. 6(b), switches 213, 215, and 217 each have their P input coupled to the drain of transistor 225 to receive the VS signal. The substrate in the p-channel transistors in switches 213, 215, and 217 are each coupled to NAVDD. The N input for each of switches 213, 215, and 217 and the substrate of each n-channel transistor in switches 213, 215, and 217 are all coupled to NAVSS.

Switches 214, 216, and 218 each have their P input coupled to the drain of transistor 226 to receive the VSX signal. The substrate in the p-channel transistors in switches 214, 216, and 218 are each coupled to NAVDD. The N input for each of switches 214, 216, and 218 and the substrate of each n-channel transistor in switches 214, 216, and 218 are all coupled to NAVSS.

N-channel transistors 201, 202, 203, 204, 205, and 206 each form a selectable transconductive load. The switch outputs for switches 213, 214, 215, 216, 217, and 218 are coupled to the gates of n-channel transistors 201, 202, 203, 204, 205, and 206, respectively. The sources and substrates of transistors 201, 202, 203, 204, 205, and 206 are each coupled to NAVSS. The drains of transistors 201, 203, and 205 are coupled to the second signal output 165. Accordingly, the output signal Vieon provided on output 165 is dependent upon the transconductances of transistors 201, 203, and 205 when these transistors are selected. The drains of transistors 202, 204, and 206 are coupled to the first signal output 164. Accordingly, the output signal Vieop provided on output 164 is dependent upon the transconductances of transistors 202, 204, and 206 when these transistors are selected.

Figure 6C:
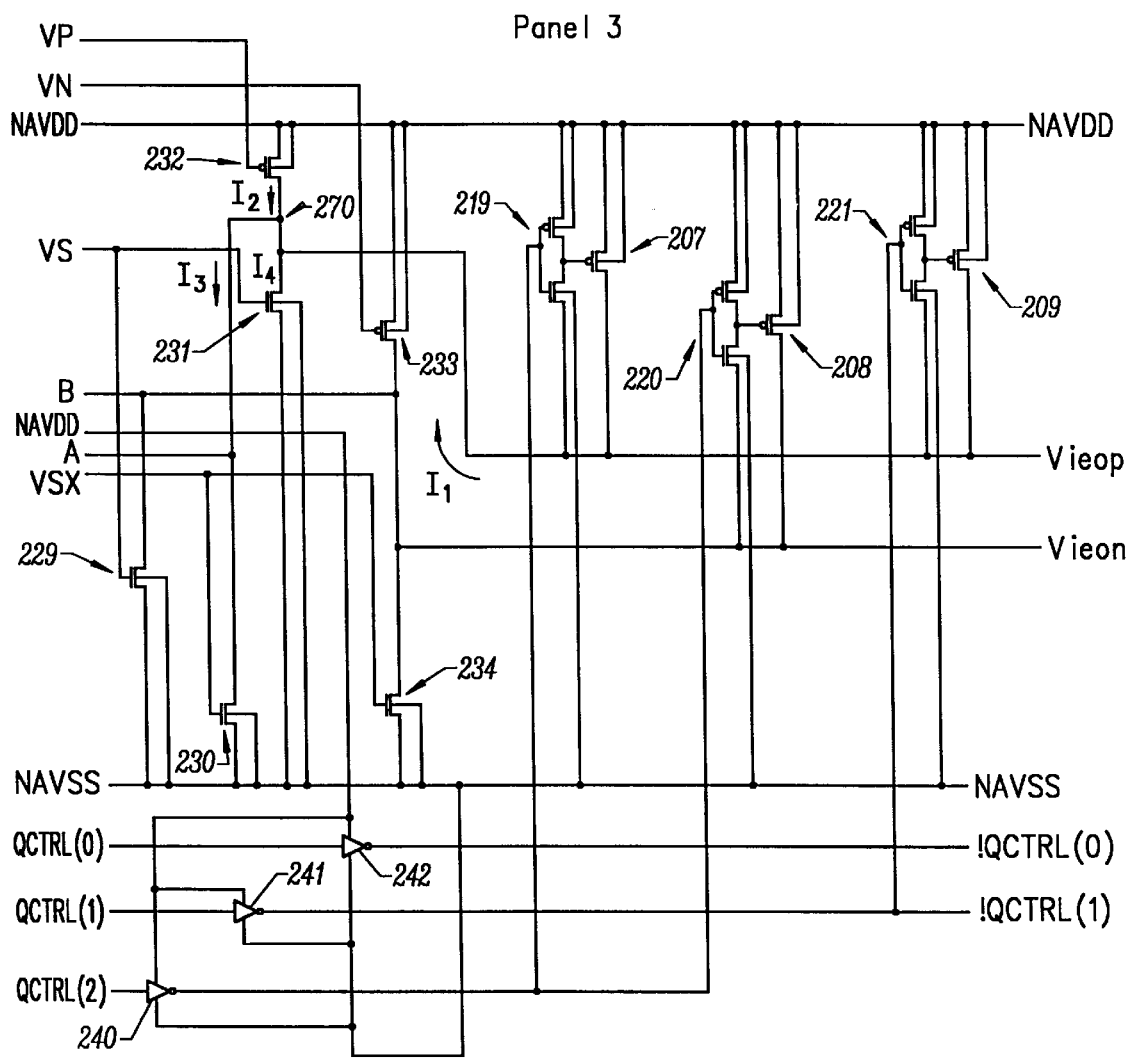

As shown in FIG. 6(c), the first signal input 162 is coupled to the gate of p-channel transistor 232, which has its source and substrate coupled to NAVDD. The drain of transistor 232 is coupled to both the first signal output 164 and the drain of n-channel transistor 231. Transistor 231 has a gate coupled to the drain of transistor 225 to receive the VS signal and a source and substrate coupled to NAVSS. N-channel transistor 230 has a gate coupled to receive the VSX signal from the drain of transistor 226 and a substrate and source both coupled to NAVSS. The drain of transistor 230 is coupled to the first signal output 164.

The second signal input 163 is coupled to the gate of p-channel transistor 233, which has its source and substrate coupled to NAVDD. The drain of transistor 233 is coupled to both the second signal output 165 and the drain of n-channel transistor 234. Transistor 234 has a gate coupled to the drain of transistor 226 to receive the VSX signal and a source and substrate coupled to NAVSS. N-channel transistor 229 has a gate coupled to receive the VS signal from the drain of transistor 225 and a substrate and source both coupled to NAVSS. The drain of transistor 229 is coupled to the second signal output 165.

Also shown in FIG. 6(c), the N inputs of switches 219 and 221 are coupled to the first signal output 164, and the P inputs of switches 219 and 221 are coupled to NAVDD. The substrate of the n-channel transistors in switches 219 and 221 are coupled to NAVSS, and the substrates of p-channel transistors of switches 219 and 221 are coupled to NAVDD. The switch outputs of switches 219 and 221 are coupled tp the gates of p-channel transistors 207 and 209, respectively. The substrates and sources of transistors 207 and 209 are coupled to NAVDD, and the drains of transistors 207 and 209 are coupled to the first signal output 164. Accordingly, the output signal Vieop provided on output 164 is dependent upon the transconductances of transistors 207 and 209 when these transistors are selected.

Figure 6D:
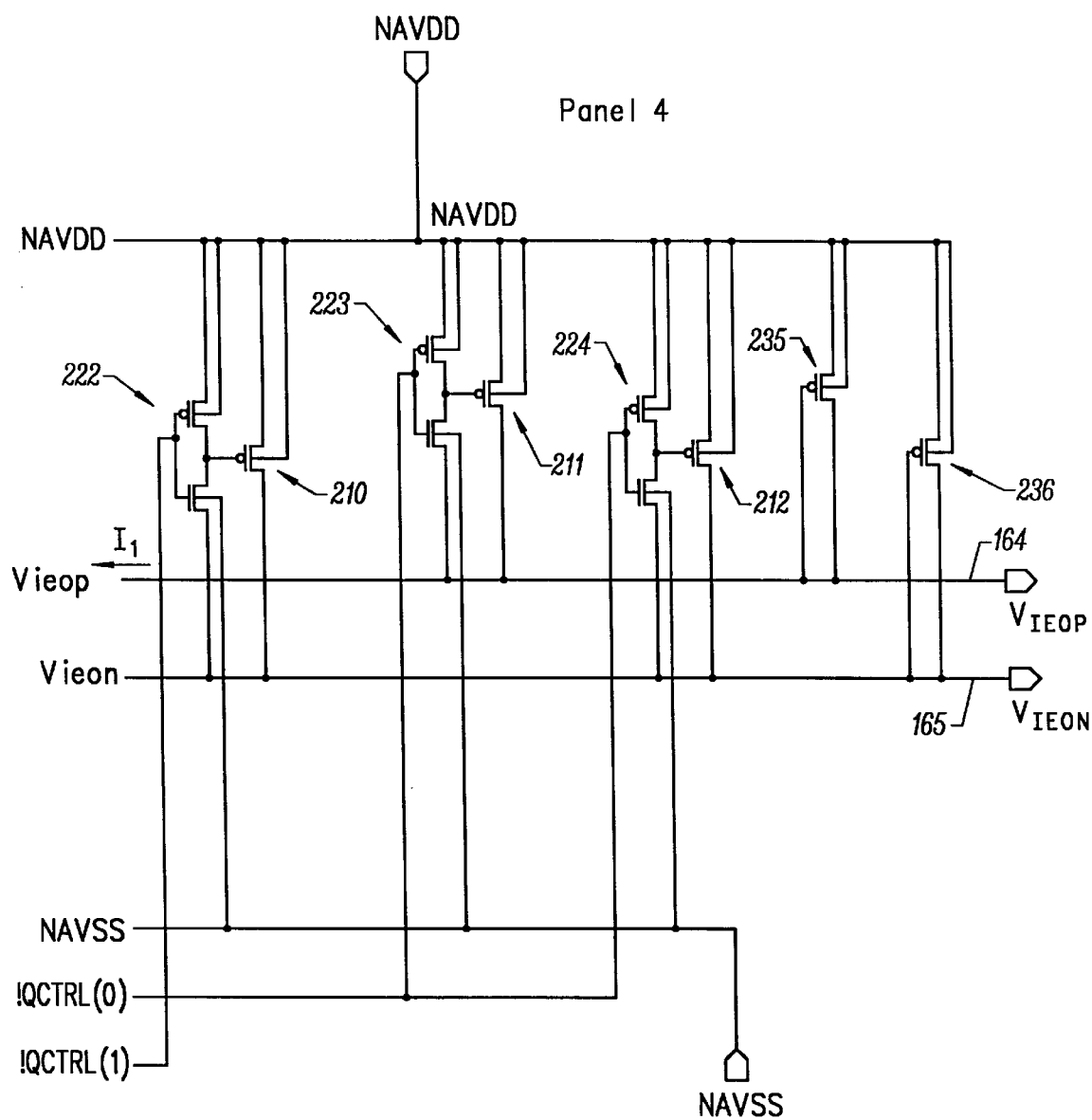

The N inputs of switches 220 (FIG. 6(c)) and 222 (FIG. 6(d)) are coupled to the second signal output 165, and the P inputs of switches 220 and 222 are coupled to NAVDD. The substrate of the n-channel transistors in switches 220 and 222 are coupled to NAVSS, and the substrates of p-channel transistors of switches 220 and 222 are coupled to NAVDD. The switch outputs of switches 220 and 222 are coupled to the gates of p-channel transistors 208 and 210, respectively. The substrates and sources of transistors 208 and 210 are coupled to NAVDD, and the drains of transistors 208 and 210 are coupled to the second signal output 165. Accordingly, the output signal Vieon provided on output 165 is dependent upon the transconductances of transistors 208 and 210 when these transistors are selected.

As shown in FIG. 6(d), switch 223 has a P input coupled to NAVDD and a N input coupled to the first signal output 164. The substrate, of the n-channel transistor in switch 223 is coupled to NAVSS, and the substrate of p-channel transistor of switch 223 is coupled to NAVDD. The switch output of switch 223 is coupled to the gate of p-channel transistor 211. The substrate and source of transistor 211 are coupled to NAVDD, and the drain of transistor 211 is coupled to the first signal output 164. Accordingly, the output signal Vieop provided on output 164 is dependent upon the transconductance of transistor 211 when this transistor is selected. P-channel transistor 235 has a source and substrate coupled to NAVDD and a gate and drain coupled to the first signal output 164.

Switch 224 has a P input coupled to NAVDD and a N input coupled to the second signal output 165. The substrate of the n-channel transistor in switch 224 is coupled to NAVSS, and the substrate of p-channel transistor of switch 224 is coupled to NAVDD. The switch output of switch 224 is coupled to the gate of p-channel transistor 212. The substrate and source of transistor 212 are coupled to NAVDD, and the drain of transistor 212 is coupled to the second signal output 165. Accordingly, the output signal Vieon provided on output 165 is dependent upon the transconductance of transistor 212 when this transistor is selected. P-channel transistor 236 has a source and substrate coupled to NAVDD and a gate and drain coupled to the second. signal output 165.

As shown in FIG. 6(a), the filter 160 includes 3 control inputs $161_{1-3}$, which are identified as QCTRL(2) $161_3$, QCTRL(1) $161_2$, and QCTRL(0) $161_1$ and collectively as QCTRL(2:0). Control signals QCTRL(2:0) each provide digital signals indicating that the input is on or off, such as a logical 1 and a logical 0, respectively.

QCTRL(2) $161_3$ is directly coupled to the switch control inputs of switches 213 and 214 and the input of inverter 240. The output of inverter 240 is coupled to the switch control inputs of switches 219 and 220. Accordingly, selectable transconductive loads 201, 202, 207, and 208 are selected in response to the digital signal provided on control input QCTRL(2) $161_3$.

QCTRL(1) 1612 is directly coupled to the switch control inputs of switches 215 and 216 and the input of inverter 241. The output of inverter 241 is coupled to the switch control inputs of switches 221 and 222. Accordingly, selectable transconductive loads 203, 204, 209, and 210 are selected in response to the digital signal provided on control input QCTRL(1) $161_2$.

QCTRL(0) 1611 is directly coupled to the switch control inputs of switches 217 and 218 and the input of inverter 242. The output of inverter 242 is coupled to the switch control inputs of switches 223 and 224. Accordingly, selectable transconductive loads 205, 206, 211, and 212 are selected in response to the digital signal provided on control input QCTRL(2) $161_3$.

Although FIGS. 6(a)–6(d) present a detailed schematic of a filter in accordance with the present invention, one with ordinary skill in the art will recognize that many other embodiments of the present invention may be constructed using different specific circuitry.

The following Table A sets forth the channel width and channel length in micrometers ("μm") for transistors 201–212 and 225–238 shown in FIGS. 6(a)–6(d) for one embodiment of the present invention. Transconductance values are provided in milliamperes per volt ("mA/V") for transistors 201–212 and 225–236, and gate capacitance values are provided in picofarads ("pf") for transistors 237 and 238. One with ordinary skill in the art will recognize that many other values may be selected for these transistors in making a filter in accordance with the present invention.

TABLE A

| Ref. No. | Channel Width (μm) | Channel Length (μm) | Transconductance (mA/V) | Gate Capacitance (pf) |
|---|---|---|---|---|
| 201 | 46.08 | 1.60 | 1.127 | |
| 202 | 46.08 | 1.60 | 1.127 | |
| 203 | 15.36 | 1.60 | 0.376 | |
| 204 | 15.36 | 1.60 | 0.376 | |
| 205 | 3.84 | 1.60 | 0.094 | |
| 206 | 3.84 | 1.60 | 0.094 | |
| 207 | 92.16 | 1.60 | 1.184 | |
| 208 | 92.16 | 1.60 | 1.184 | |
| 209 | 30.72 | 1.60 | 0.395 | |
| 210 | 30.72 | 1.60 | 0.395 | |
| 211 | 7.68 | 1.60 | 0.099 | |
| 212 | 7.68 | 1.60 | 0.099 | |
| 225 | 153.60 | 1.60 | 2.366 | |
| 225 | 153.60 | 1.60 | 2.366 | |
| 227 | 76.80 | 1.60 | 2.618 | |
| 228 | 76.80 | 1.60 | 2.618 | |
| 229 | 3.84 | 1.60 | 0.094 | |
| 230 | 3.84 | 1.60 | 0.094 | |
| 231 | 76.80 | 1.60 | 2.618 | |
| 232 | 153.60 | 1.60 | 2.366 | |
| 233 | 153.60 | 1.60 | 2.366 | |
| 234 | 76.80 | 1.60 | 2.618 | |
| 235 | 7.68 | 1.60 | 0.099 | |
| 236 | 7.68 | 1.60 | 0.099 | |
| 237 | 40.00 | 40.00 | | 3.10 |
| 238 | 40.00 | 40.00 | | 3.10 |

In operation, the filter 160 shown in FIGS. 6(a)–6(d) has the same transfer function between the first signal input 162 and first signal output 164 as between the second signal input 163 and second signal output 165. In order to demonstrate the operation of filter 160, as shown in FIGS. 6(a)–6(d), the transfer function for the first signal input 162 and first signal output 164 is derived below in the s-domain.

As shown in FIG. 6(c), the following current relationship exists at node 270:

$$I1 = I3 + I4 - I2 \quad \text{(Equation 3)}$$

wherein:

I1 is the combined drain current of transistors 207, 209, 211, and 235;

I2 is the drain current of transistor 232;

I3 is the combined drain current of transistors 230, 206, 204, and 202; and

I4 is the drain current of transistor 231.

The currents I1, I2, I3, and I4 may be expressed as follows:

$$I1 = (-Vieop*G_{235} + !QCTRL(0)*G_{211} + !QCTRL(1)*G_{209} + !QCTRL(2)*G_{207}) \quad \text{(Equation 4)}$$

$$I2 = (-VP*G_{232}) \quad \text{(Equation 5)}$$

$$I3 = (VSX*G_{230} + VSX*!QCTRL(0)*G_{206} + VSX*!QCTRL(1)*G_{204} +$$

$$VSX*!QCTRL(2)*G_{202})\quad\text{(Equation 6)}$$

$$I4=VS*G_{231}\quad\text{(Equation 7)}$$

Since the filter 160 as shown in FIGS. 6(*a*)–6(*d*) is fully differential, VSX is equal to −VS. Accordingly, current I3 may be expressed as follows:

$$I3=-VS*(G_{230}+!QCTRL(0)*G_{206}+!QCTRL(1)*G_{204}+\\!QCTRL(2)*G_{202})\quad\text{(Equation 8)}$$

Next, VS is expressed with respect to VP, as follows, by analyzing the circuitry shown in FIG. 6(*a*):

$$-VP*G_{225}=VS*(s*C+G_{227})\quad\text{(Equation 9)}$$

$$VS=(-VP*G_{225})/(s*C+G_{227})\quad\text{(Equation 10)}$$

Accordingly, output signal Vieop may be expressed as follows:

$$Vieop=-I1/(G_{235}+!QCTRL(0)*G_{211}+!QCTRL(1)*G_{209}+\\!QCTRL(2)*G_{207})\quad\text{(Equation 11)}$$

$$Vieop=-(I3+I4-I2)/(G_{235}+!QCTRL(0)*G_{211}+!QCTRL(1)*G_{209}+\\!QCTRL(2)*G_{207})\quad\text{(Equation 12)}$$

$$Vieop=[(VS*(G_{230}+!QCTRL(0)*G_{206}+!QCTRL(1)*G_{204}+\\!QCTRL(2)*G_{202}))-(VS*G_{231})-(VP*G_{232})]/(G_{235}+\\!QCTRL(0)*G_{211}+!QCTRL(1)*G_{209}+\\!QCTRL(2)*G_{207})\quad\text{(Equation 13)}$$

$$Vieop=[(((-VP*G_{225})/(s*C+G_{227}))*(G_{230}+!QCTRL(0)*G_{206}+\\!QCTRL(1)*G_{204}+!QCTRL(2)*G_{202}))-(((-VP*G_{225})/(s*C+\\G_{227}))*G_{231})-(VP*G_{232})]/(G_{235}+!QCTRL(0)*G_{211}+!\\QCTRL(1)*G_{209}+!QCTRL(2)*G_{207})\quad\text{(Equation 14)}$$

Since $G_{225}$ is equal to $G_{232}$, Vieop may be expressed as follows:

$$Vieop=[(-VP*G_{225})/(G_{235}+QCTRL(0)*G_{211}+!QCTRL(1)*G_{209}+\\!QCTRL(2)*G_{207})]*[((1/(s*C+G_{227}))*(G_{230}+!QCTRL(0)*G_{206}+\\!QCTRL(1)*G_{204}+!QCTRL(2)*G_{202}))-\\((1/(s*C+G_{227}))*G_{227})+1]\quad\text{(Equation 15)}$$

$$Vieop=[(-VP*G_{225})/(G_{235}+!QCTRL(0)*G_{211}+!QCTRL(1)*G_{209}+\\!QCTRL(2)*G_{207})]*[(G_{230}+!QCTRL(0)*G_{206}+\\!QCTRL(1)*G_{204}+!QCTRL(2)*G_{202})-(G_{227})+(s*C+G_{227})]/\\(s*C+G_{227})\quad\text{(Equation 16)}$$

$$Vieop=[(-VP*G_{225})/(G_{235}+!QCTRL(0)*G_{211}+!QCTRL(1)*G_{209}+\\!QCTRL(2)*G_{207})]*[((G_{230}+!QCTRL(0)*G_{206}+\\!QCTRL(1)*G_{204}+!QCTRL(2)*G_{202})/C)-((G_{227})/C)+(s+(G_{227}/\\C))]/(s+(G_{227}/C))\quad\text{(Equation 17)}$$

$$Vieop=[(-VP*G_{225})/(G_{235}+!QCTRL(0)*G_{211}+!QCTRL(1)*G_{209}+\\!QCTRL(2)*G_{207})]*[(s+(G_{230}+!QCTRL(0)*G_{206}+\\!QCTRL(1)*G_{204}+\\!QCTRL(2)*G_{202})/C)/(s+G_{227}/C)]\quad\text{(Equation 18)}$$

The transfer function is therefore expressed as follows:

$$Vieop/VP=[(-G_{225})/(G_{235}+!QCTL(0)*G_{211}+!QCTRL(1)*G_{209}+\\!QCTRL(2)*G_{207})]*[(s+(G_{230}+!QCTRL(0)*G_{206}+\\!QCTRL(1)*G_{204}+\\!QCTRL(2)*G_{202})/C)/(s+G_{227}/C)]\quad\text{(Equation 19)}$$

Accordingly, filter 160 has the following single zero and single pole:

$$\text{Pole}=G_{227}/C$$

$$\text{Zero}=(G_{230}+!QCTRL(0)*G_{206}+!QCTRL(1)*G_{204}+\\!QCTRL(2)*G_{202})/C$$

As can be seen from equation 19, the value of the transfer function (Vieop/VP) for the first signal input 162 and first signal output 164 is set in response to the state of the control inputs QCTRL(2:0) 161$_{1-3}$, which provide for selecting and deselecting the selectable transconductive loads 201–212. Accordingly, the filter's transfer functions may be set to different values to provide compensation for signals being received from different lengths of transmission cable.

Figure 1:
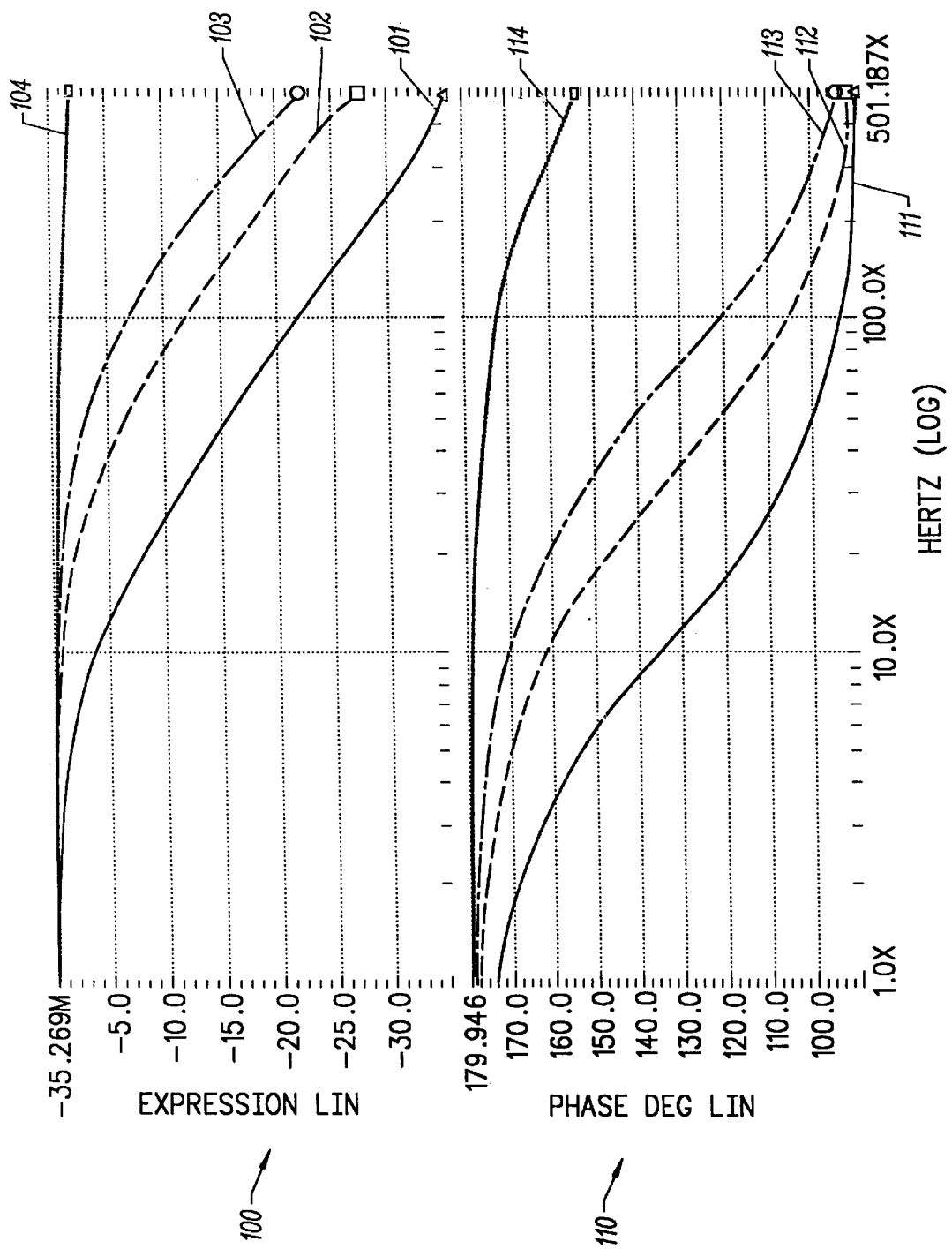
FIG. 1 illustrates graphs depicting the amplitude attenuation and phase shift suffered by high frequency signals on 100 Base-TX Category 5 unshielded twisted pair cable.
Figure 2:
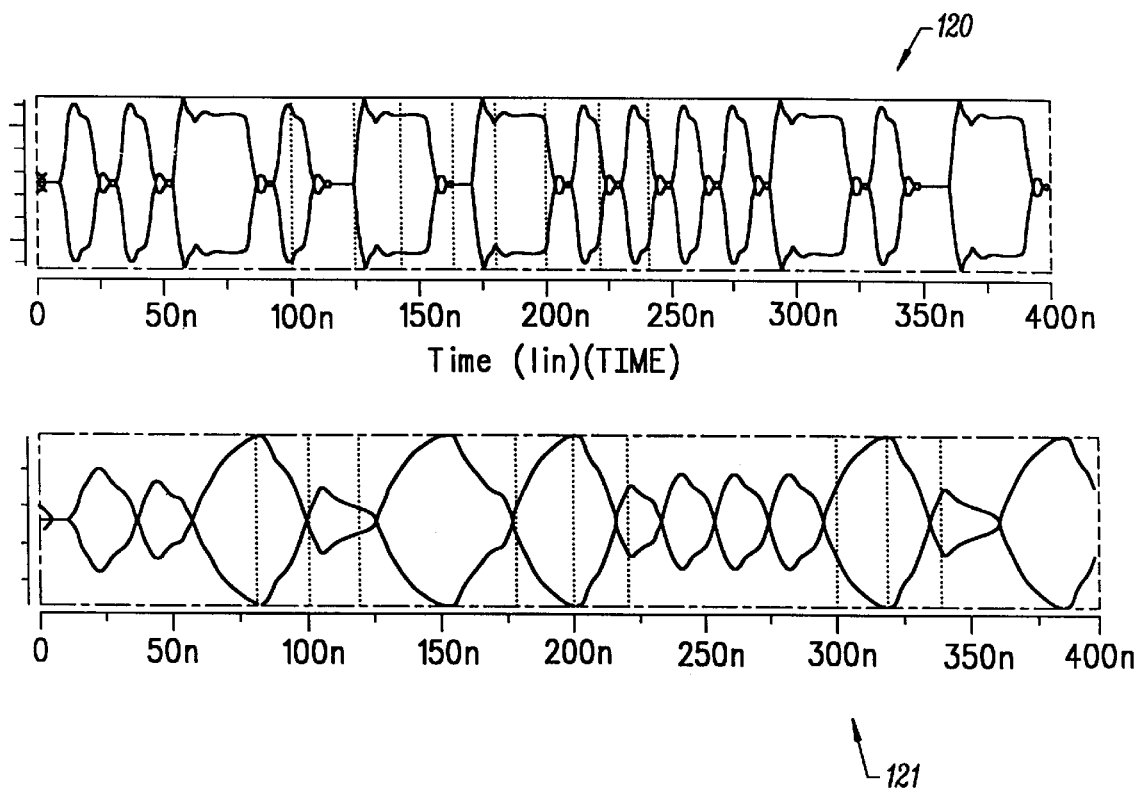
FIG. 2 illustrates the distortion suffered by a bit stream of signals on a 100 Base-TX Category 5 unshielded twisted pair cable.
Figure 7:
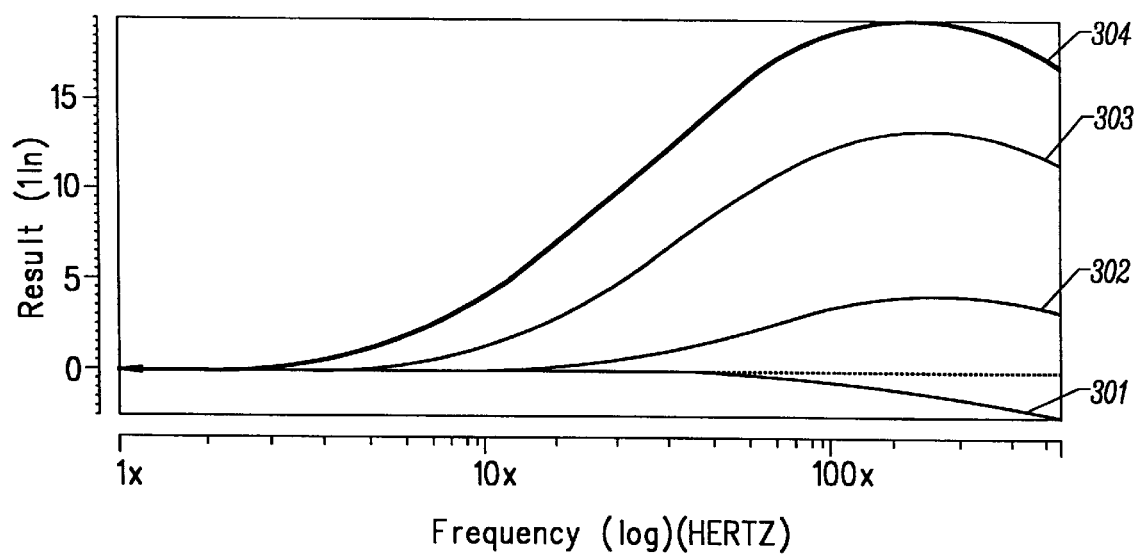
FIG. 7 illustrates a graphical representation of a set of selectable transfer functions for the filter shown in FIGS. 6(*a*)–6(*d*).

FIG. 7 illustrates four possible characteristic curves for the transfer function in Equations 2 and 19 over a frequency range of 1 MHZ to over 100 MHZ. The curves 301, 302, 303, and 304 shown, correspond to the QCTRL(2:0) inputs 161$_{1-3}$ being set to 000, 100, 110, and 111, respectively, with the most significant bit (left bit) of each value corresponding QCTRL(2) and the least significant bit (right bit) of each value corresponding to QCTRL(0). The amplitude of curves 302–304 each increase as the frequency increases. This shows that different selected values for the transfer function in Equation 2 and 19 will be useful for offsetting the distortion caused to high frequency signals by transmission lines, as shown in FIG. 1.

Figure 8:
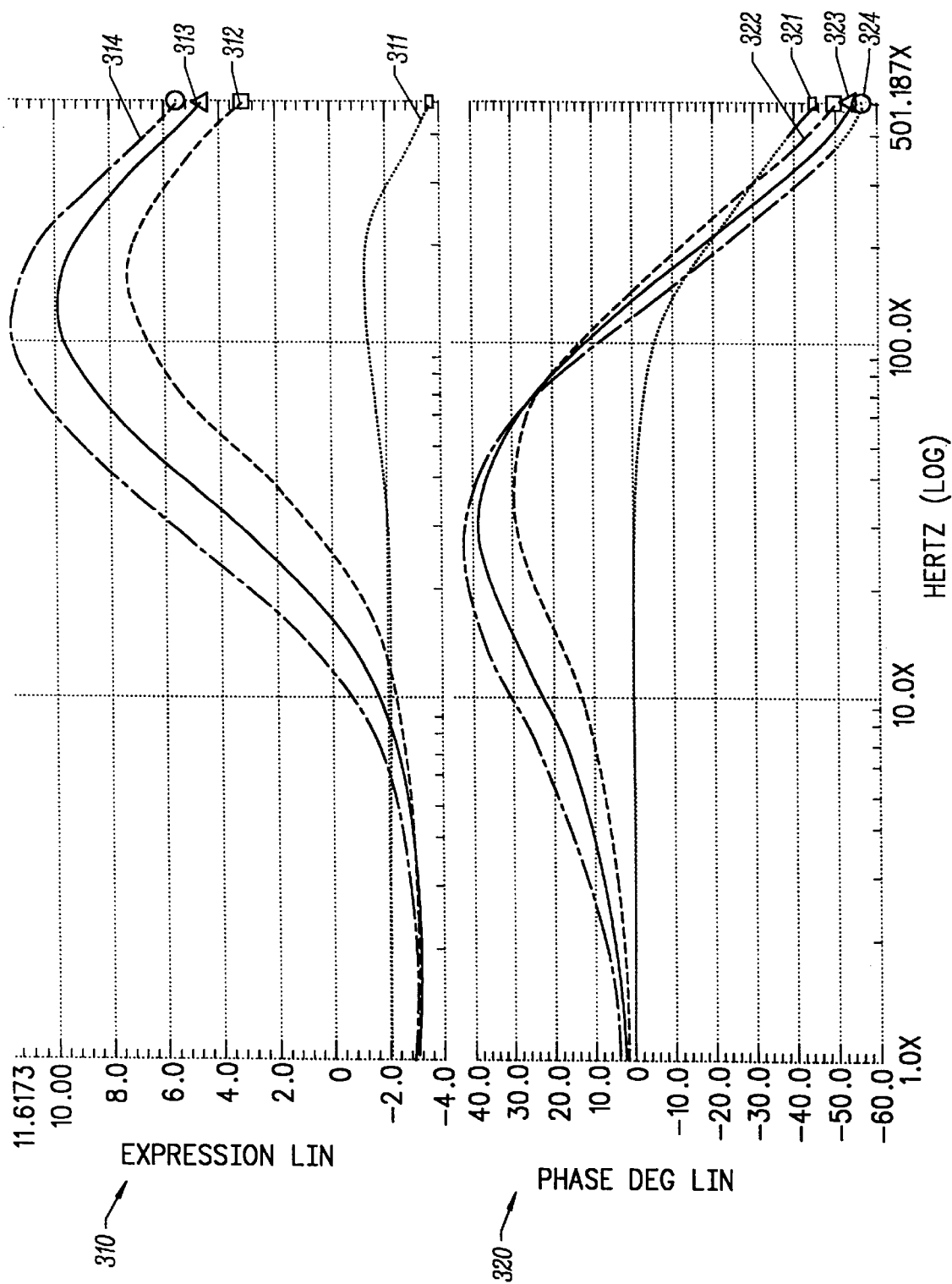
FIG. 8 illustrates graphs depicting the amplitude enhancement and phase shift correction provided by the filter in FIGS. 6(*a*)–6(*d*).

FIG. 8 shows two graphs 310 and 320 for the filter 160 embodiment shown in FIGS. 6(*a*)–6(*d*). Graph 310 shows the signal amplitude that a signal can gain by being passed through filter 160. Graph 310 includes four different curves 311, 312, 313, and 314 corresponding to the setting of the QCTRL(2:0) inputs 161$_{1-3}$ being 000, 100, 110, and 111, respectively.

Graph 320 shows the phase shift that a signal undergoes by being passed through filter 160. Graph 320 includes four different curves 321, 322, 323, and 324 corresponding to the setting of the QCTRL(2:0) inputs 161$_{1-3}$ being 000, 100, 110, and 111, respectively.

As can be seen from graphs 310 and 320, the QCTRL(2:0) input 161$_{1-3}$ can be used to set the transfer functions of the filter 160 to values that best provide for offsetting the distortion caused to a signal by different lengths of transmission line in a 100 Base-TX IEEE 802.3u Standard network. The slope of the curves in FIG. 8 are functions of the ratio of the filter's zero to the filter's pole. For filter 160, as shown in FIGS. 6(*a*)–6(*d*), this ratio is purely a function of the control inputs 161$_{1-3}$ and transconductances. Accordingly, the slopes of the curves shown in FIG. 8, as well as other possible transfer function characteristic curves, can be well controlled for filter 160 by using standard digital CMOS technology to form transconductance load transistors.

Figure 9:
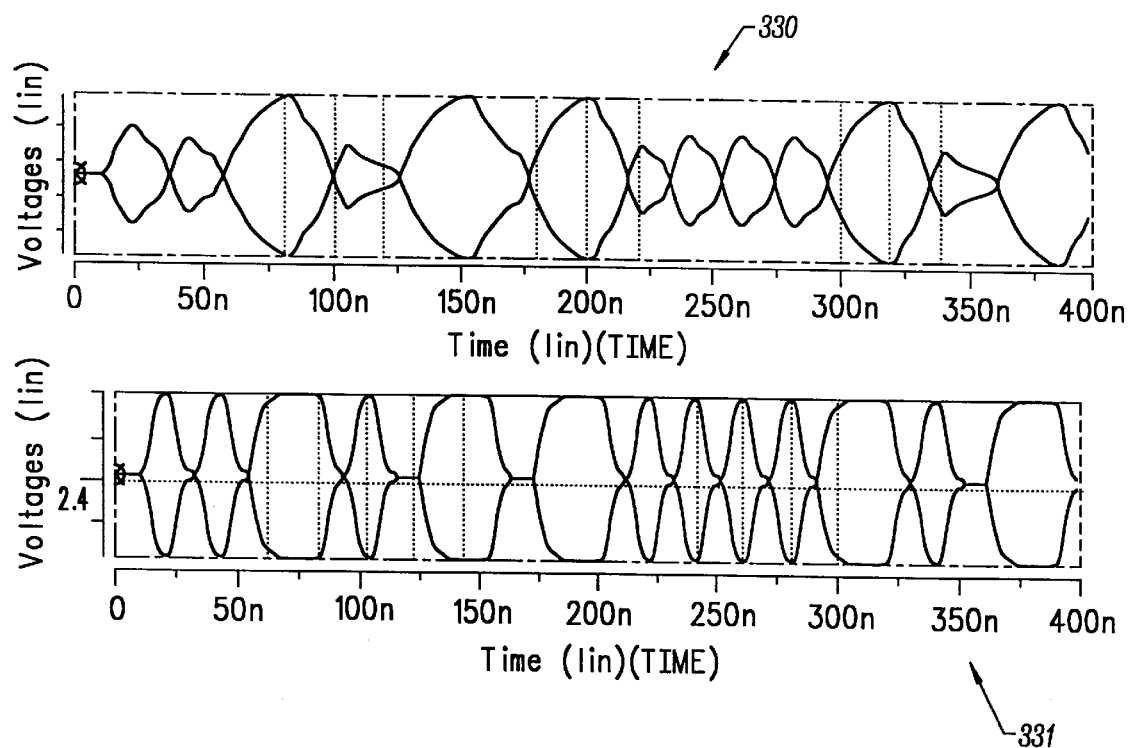
FIG. 9 illustrates the compensation provided for a 125 MHZ bit stream of signals on 100 Base-TX Category 5 unshielded twisted pair cable.

FIG. 9 illustrates two bit streams 330 and 331 in a 100 Base-TX IEEE 802.3u Standard network. On a horizontal axis below the signals in each bit stream 330 and 331 a measure of time is provided. Bit stream 330 is a set of bits represented by differential three level analog signals afer traveling a distance of 100 meter on a 100 Base-TX Category 5 unshielded twisted pair cable.

Bit stream 331 shows the same bits from bit stream 330 after being passed through the embodiment of filter 160 shown in FIGS. 6(*a*)–6(*d*) with the QCTRL(2), QCTRL(1), and QCTRL(0) control inputs 161$_{1-3}$ set to the following logical values 1, 1, and 1, respectively. As can be seen from FIG. 9, the filter 160 removed a significant amount of distortion from the bit stream. After passing through the filter 160, the bit stream more closely resembles the bit stream as initially transmitted, which was shown and described earlier with reference to graph 120 in FIG. 1.

Although the invention has been described above with particularity, this was merely to teach one of ordinary skill in the art how to make and use the invention. Many modifications will fall within the scope of the invention, as that scope is defined by the following claims.

What is claimed is:

1. A filter having a first transfer function, said filter comprising:

a first signal input for receiving a first input signal;

a first signal output operatively coupled to said first signal input for providing a first output signal, wherein a ratio of said first output signal to said first input signal is equal to said first transfer function, wherein said first transfer function has a single pole;

a set of control inputs, wherein each control input in said set of control inputs is adapted for providing a digital signal;

a first set of selectable transconductive loads, wherein each selectable transconductive load in said first set of selectable transconductive loads has a transconductance and is operatively coupled to said first signal output and a control input in said set of control inputs;

a second signal input for receiving a second input signal;

a second signal output operatively coupled to said second signal input for providing a second output signal, wherein a ratio of said second output signal to said second input signal is equal to a second transfer function; and a second set of selectable transconductive loads, wherein each selectable transconductive load in said second set of selectable transconductive loads has a transconductance and is operatively coupled to said second signal output and a control input in said set of control inputs.

2. The filter of claim 1, wherein each selectable transconductive load in said first set of selectable transconductive loads is selected in response to a signal provided on at least one control input in said set of control inputs.

3. The filter of claim 2, wherein a value for said first transfer function is set in response to a digital signal provided by at least one control input in said set of control inputs to a selectable transconductive load in said first set of selectable transconductive loads.

4. The filter of claim 1, further including a first set of switches, wherein each switch in said first set of switches is coupled to a respective selectable transconductive load in said first set of selectable transconductive loads and a control input in said set of control inputs.

5. The filter of claim 4, wherein a selectable transconductive load in said first set of selectable transconductive loads is selected in response to a digital signal being provided to a switch in said first set of switches, wherein said switch is coupled to said selectable transconductive load in said first set of selectable transconductive loads, wherein said digital signal being provided to said switch is provided by a control input in said set of control inputs.

6. The filter of claim 5, wherein a value for said first transfer function is dependent upon a transconductance provided by at least one selected selectable transconductive load in said first set of selectable transconductive loads.

7. The filter of claim 6, further including a first set of fixed transconductive loads, wherein each fixed transconductive load in said first set of fixed transconductive loads has a transconductance and is operatively coupled to said first signal output.

8. The filter of claim 7, wherein a value for said first transfer function is dependent upon transconductances provided by transconductive loads in said first set of fixed transconductive loads.

9. The filter of claim 8, wherein said first transfer function has a zero, wherein a ratio of said zero to said single pole is dependent upon only digital signals provided by said set of control inputs, a transconductance of at least one selectable transconductive load in said first set of selectable transconductive loads, and a transconductance of at least one fixed transconductive load in said first set of fixed transconductive loads.

10. The filter of claim 1, wherein said first transfer function has a single zero.

11. The filter of claim 10, wherein said single zero is programmable with respect to said single pole.

12. The filter of claim 11, wherein a ratio of said single zero to said single pole is set in response to a digital signal provided by at least one control input in said set of control inputs.

13. The filter of claim 11, wherein a ratio of said single zero to said single pole is not dependent on a precise value of any resistor or capacitor.

14. The filter of claim 1, wherein said filter is implemented in an integrated circuit using complementary metal oxide semiconductor technology.

15. The filter of claim 1, further including a second set of switches, wherein each switch in said second set of switches is coupled to a respective selectable transconductive load in said second set of selectable transconductive loads and a control input in said set of control inputs.

16. The filter of claim 15, wherein a selectable transconductive load in said second set of selectable transconductive loads is selected in response to a digital signal being provided to a switch in said second set of switches, wherein said switch is coupled to said selectable transconductive load in said second set of selectable transconductive loads, wherein said digital signal being provided to said switch is provided by a control input in said set of control inputs.

17. The filter of claim 16, wherein a value for said second transfer function is dependent upon a transconductance provided by at least one selected selectable transconductive load in said second set of transconductive loads.

18. The filter of claim 17, wherein for each selectable transconductive load in said first set of selectable transconductive loads there is a selectable transconductive load in said second set of selectable transconductive loads having a transconductance that matches a transconductance of said selectable transconductive load is said first set of selectable transconductive loads.

19. The filter of claim 18, further including a second set of fixed transconductive loads, wherein each fixed transconductive load in said second set of fixed transconductive loads has a transconductance and is operatively coupled to said second signal output.

20. The filter of claim 19, wherein a value for said second transfer function is dependent upon transconductances provided by at least one fixed transconductive load in said second set of fixed transconductive loads.

21. The filter of claim 1, wherein said first transfer function and said second transfer function are equal.

22. A filter having a first transfer function and a second transfer function, said filter comprising:

a first signal input for receiving a first input signal;

a first signal output operatively coupled to said first signal input for providing a first output signal, wherein a ratio of said first output signal to said first input signal is equal to said first transfer function, wherein said first transfer function is programmable;

a set of control inputs, wherein each control input in said set of control inputs is adapted for providing a digital signal;

a first set of selectable transconductive loads, wherein each selectable transconductive load in said first set of selectable transconductive loads has a transconductance and is operatively coupled to said first signal output and a control input in said first set of control inputs;

a second signal input for receiving a second input signal;

a second signal output operatively coupled to said second signal input for providing a second output signal, wherein a ratio of said second output signal to said second input signal is equal to said second transfer function, wherein said second transfer function is programmable; and a second set of selectable transconductive loads, wherein each selectable transconductive load in said second set of selectable transconductive loads has a transconductance and is operatively coupled to said second signal output and a control input in said set of control inputs.

23. The filter of claim 22, further including:

a first set of switches, wherein each switch in said first set of switches is coupled to a respective selectable transconductive load in said first set of selectable transconductive loads and a control input in said set of control inputs, wherein a selectable transconductive load in said first set of selectable transconductive loads is selected in response to a digital signal being provided to a switch in said first set of switches, wherein said switch is coupled to said selectable transconductive load in said first set of selectable transconductive loads, wherein said digital signal being provided to said switch is provided by a control input in said set of control inputs.

24. The filter of claim 23, wherein a value for said first transfer function is set in response to a digital signal provided by at least one control input in said set of control inputs.

25. The filter of claim 24, further including:

a first set of fixed transconductive loads, wherein each fixed transconductive load in said first set of fixed transconductive loads has a transconductance and is operatively coupled to said first signal output; and a capacitive load coupled to said first signal input.

26. The filter of claim 25, wherein a value for said first transfer function is dependent upon a transconductance provided by at least one transconductive load in said first set of fixed transconductive loads and said capacitance.

27. The filter of claim 25, wherein said first transfer function has a zero and a single pole and a ratio of said zero to said single pole is dependent upon only digital signals provided by said set of control inputs, a transconductance of at least one selectable transconductive load in said first set of selectable transconductive loads, and a transconductance of at least one fixed transconductive load in said first set of fixed transconductive loads.

28. The filter of claim 22, wherein said first transfer function has a zero and a single pole and a ratio of said zero to said single pole is dependent upon a digital signal provided by at least one control input in said set of control inputs.

29. The filter of claim 28, wherein a ratio of said zero to said single pole is not dependent on a precise value of any resistor or capacitor.

30. The filter of claim 22, wherein a value for said first transfer function is dependent upon a transconductance provided by at least one selected selectable transconductive load in said first set of selectable transconductive loads.

31. A filter having a first transfer function and a second transfer function, said filter comprising:

a first signal input for receiving a first input signal with a frequency of at least 125 megahertz;

a first signal output operatively coupled to said first signal input for providing a first output signal, wherein a ratio of said first output signal to said first input signal is equal to said first transfer function, wherein said first transfer function is programmable;

a set of control inputs, wherein each control input in said set of control inputs is adapted for providing a digital signal;

a first set of selectable transconductive loads, wherein each selectable transconductive load in said first set of selectable transconductive loads has a transconductance and is operatively coupled to said first signal output and a control input in said set of control inputs;

a second signal input for receiving a second input signal having a frequency of at least 125 megahertz;

a second signal output operatively coupled to said second signal input for providing a second output signal, wherein a ratio of said second output signal to said second input signal is equal to said second transfer function, wherein said second transfer function is programmable; and a second set of selectable transconductive loads, wherein each selectable transconductive load in said second set of selectable transconductive loads has a transconductance and is operatively coupled to said second signal output and a control input in said set of control inputs.

32. The filter of claim 31, wherein said first transfer function equals said second transfer function.

33. The filter of claim 31, wherein said first input signal and said second input signal are compliant with the IEEE 802.3u standard.

* * * * *